Figure 1:
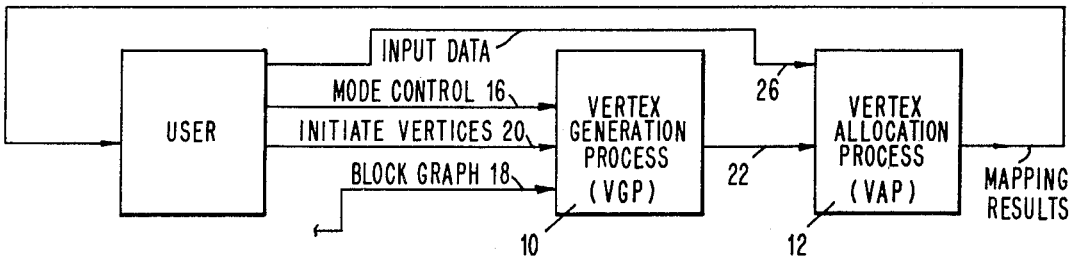
Figure 4:
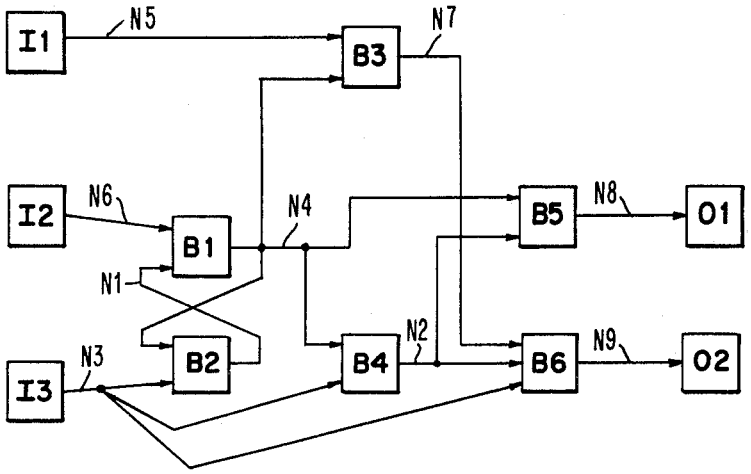
Figure 4A:
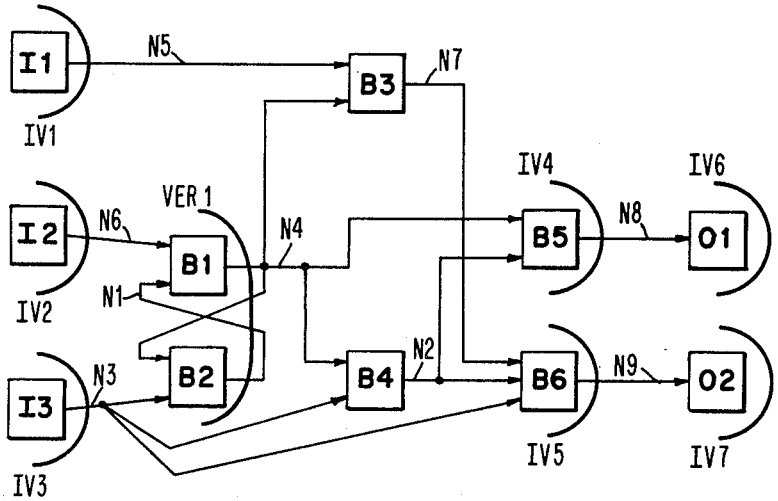
Figures 2, 2A:
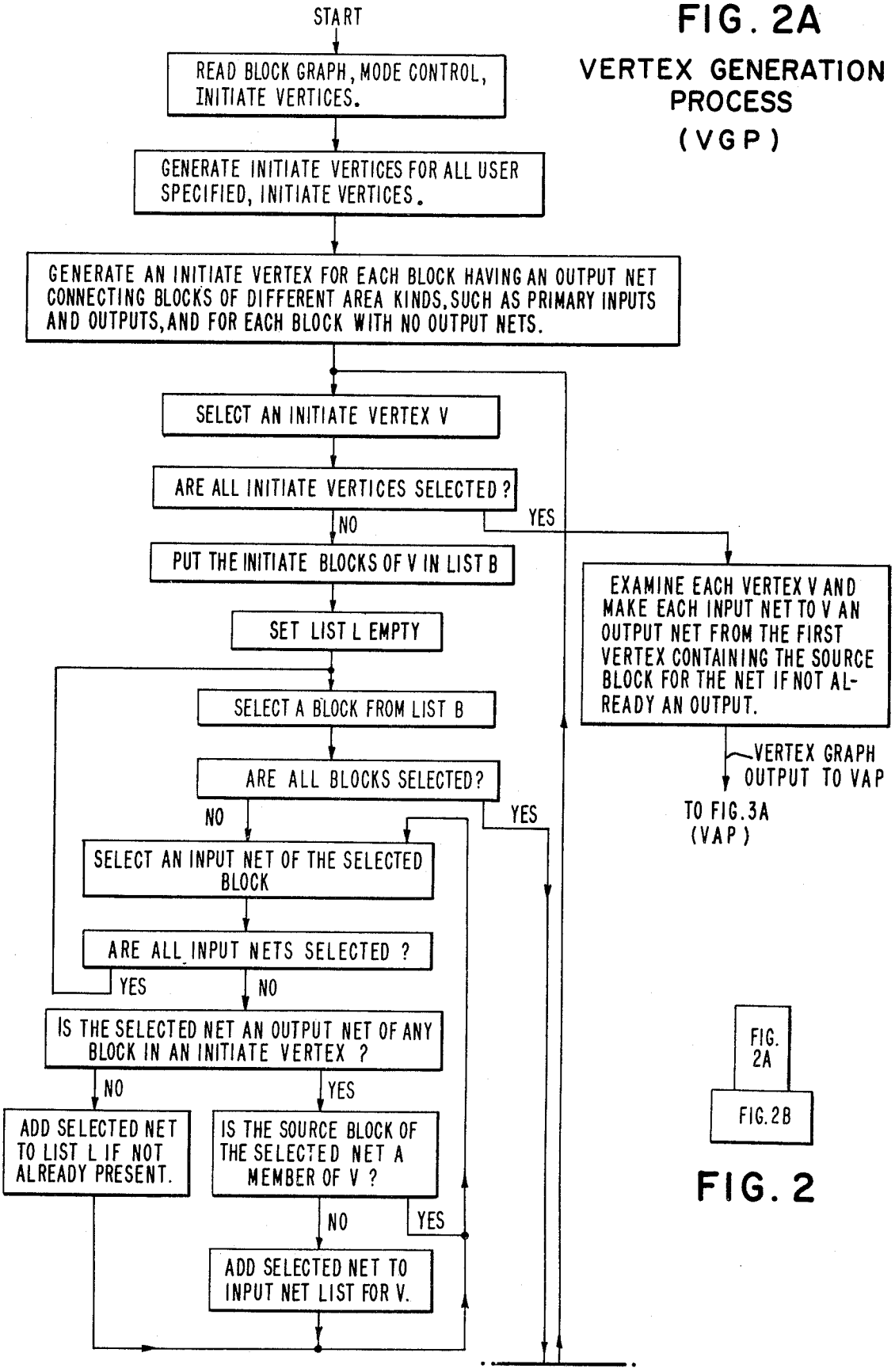
Figure 2B:
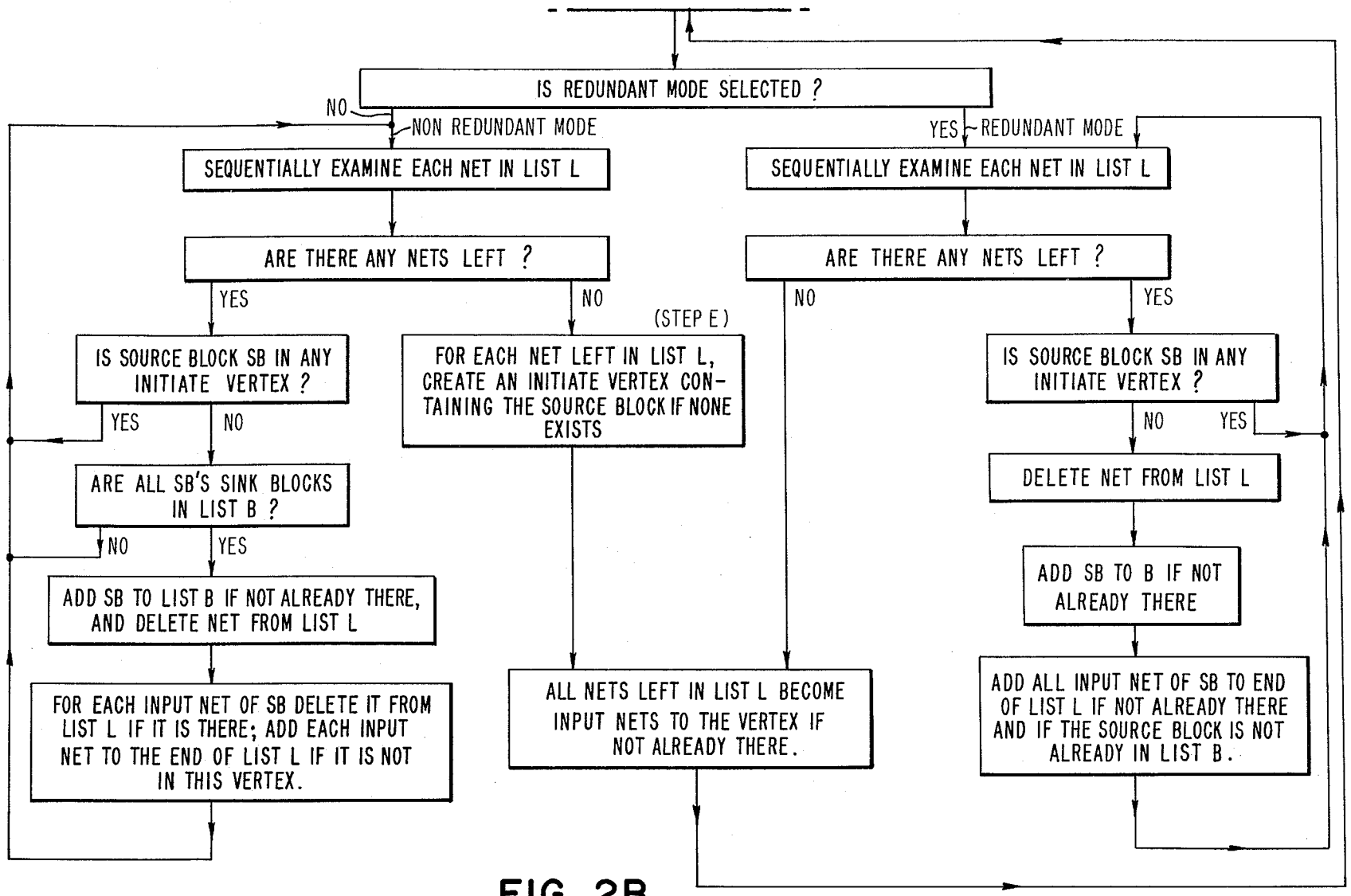
Figures 3, 3A:
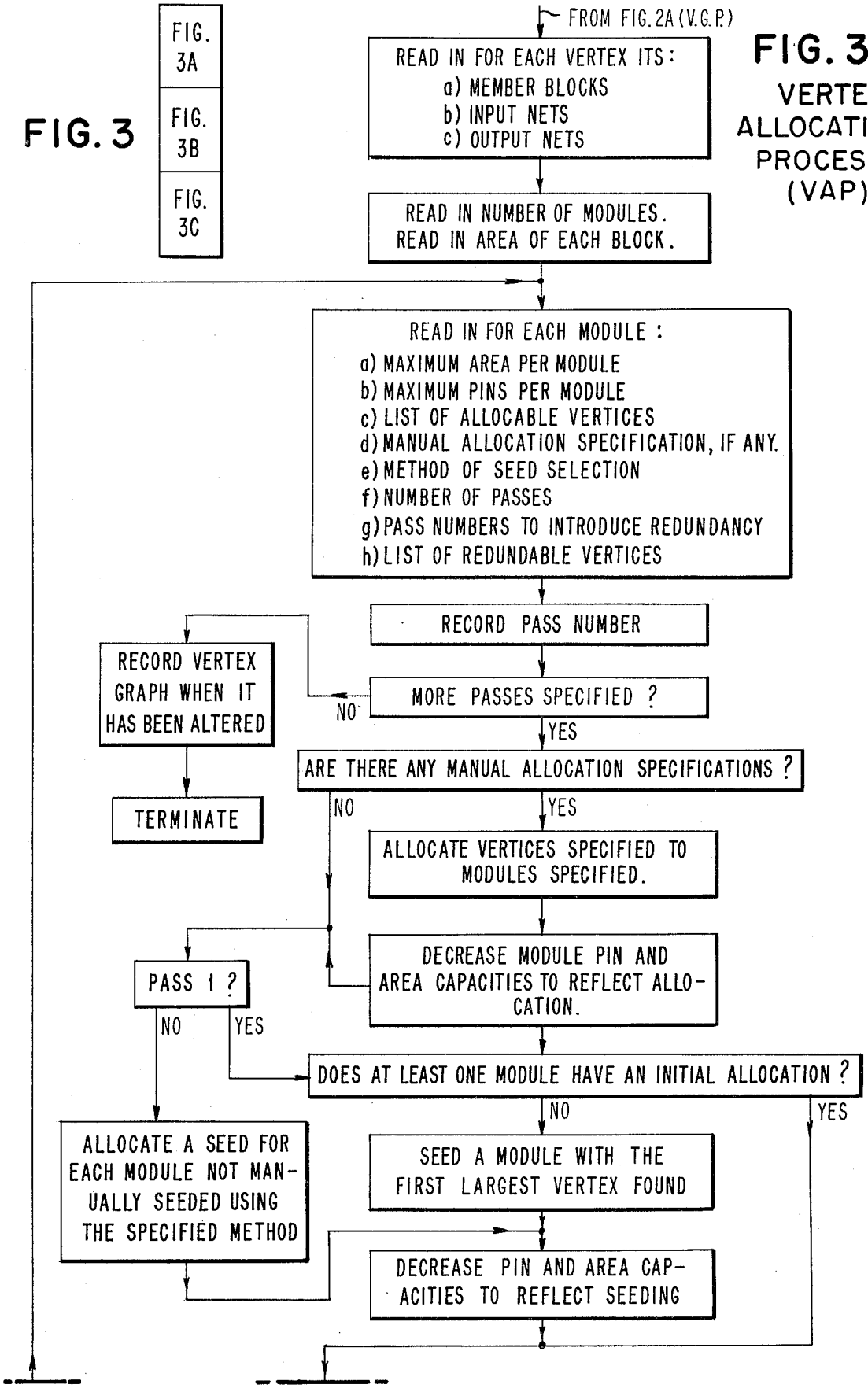
Figure 3B:
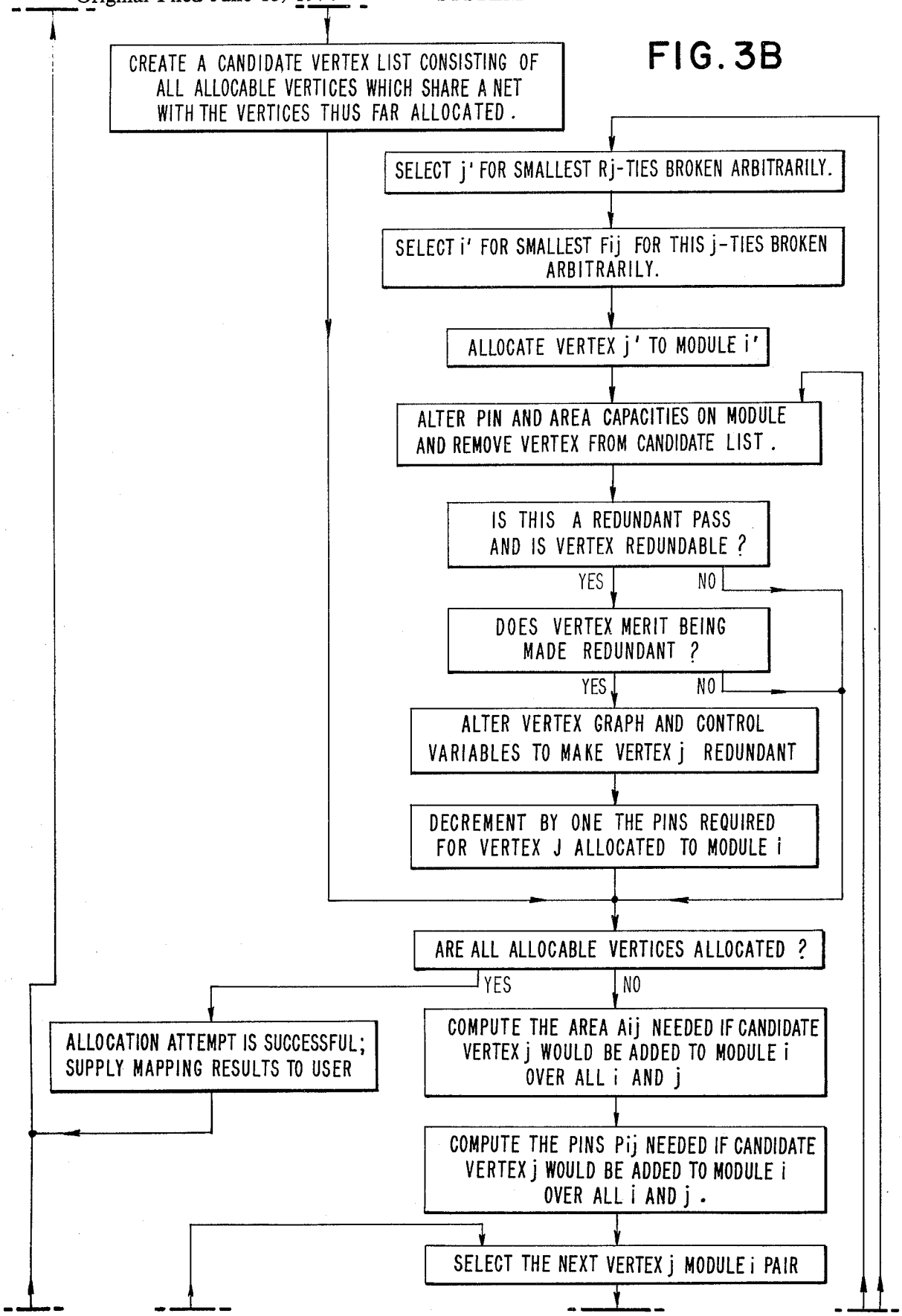
Figure 3C:
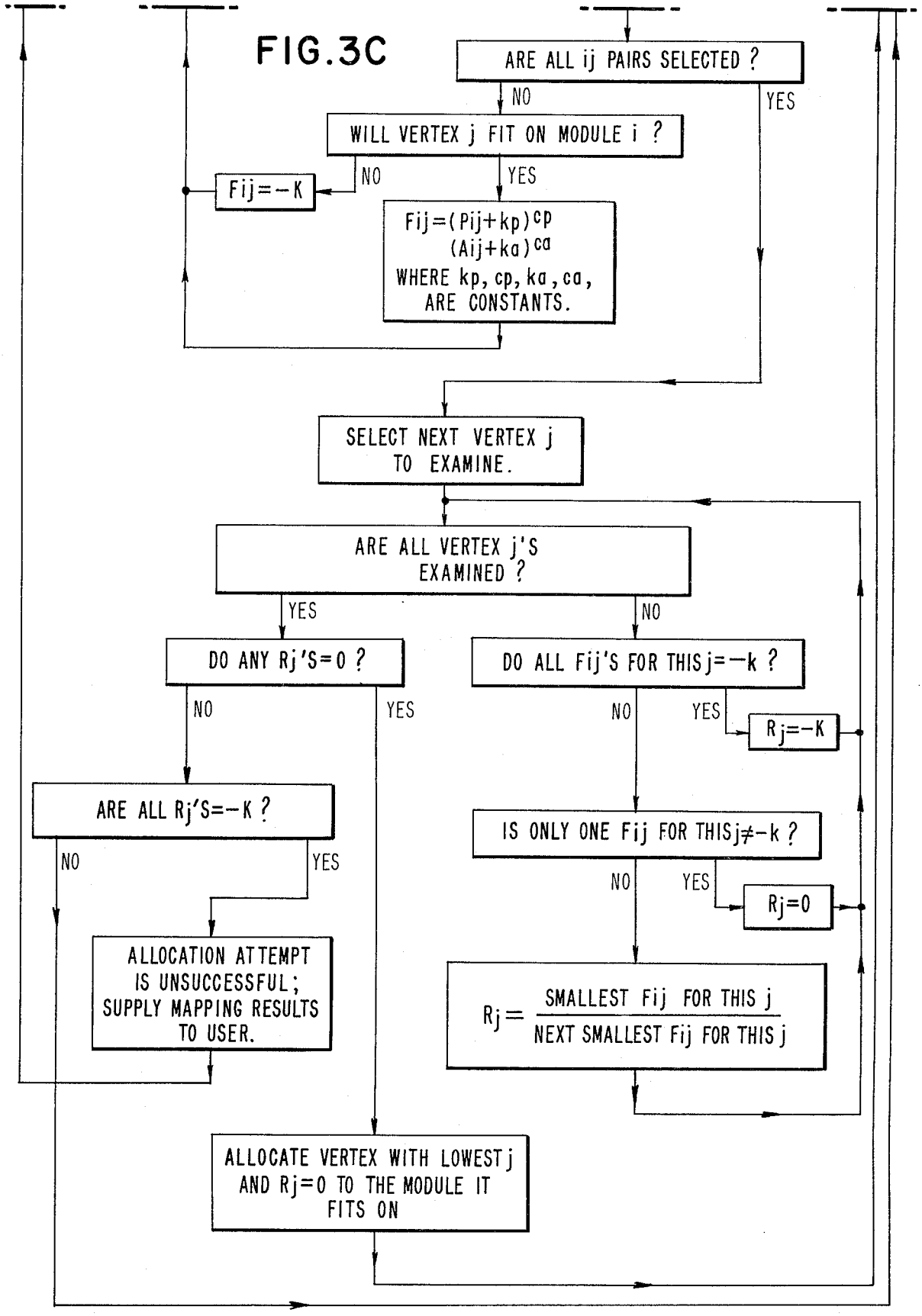
Figure 5:
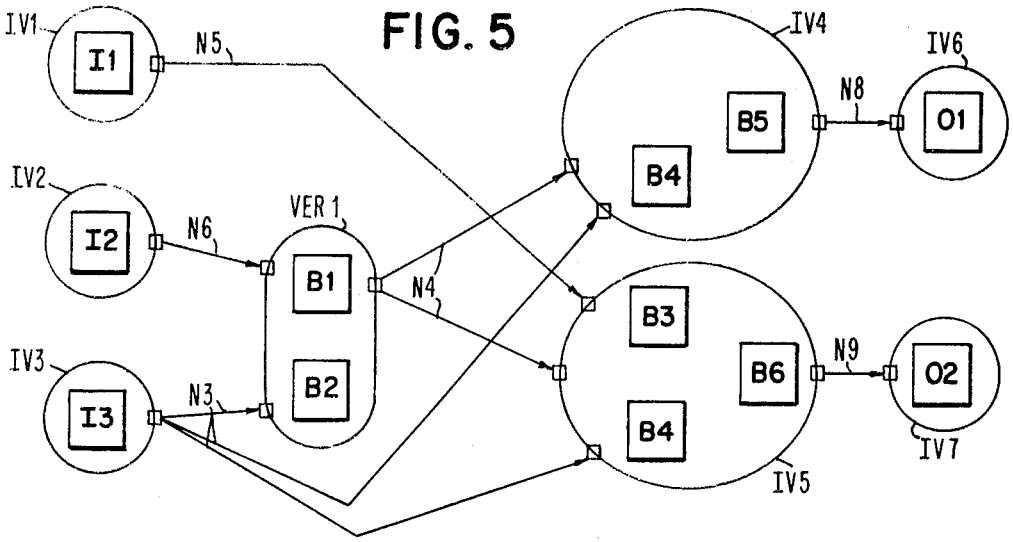
Figure 6:
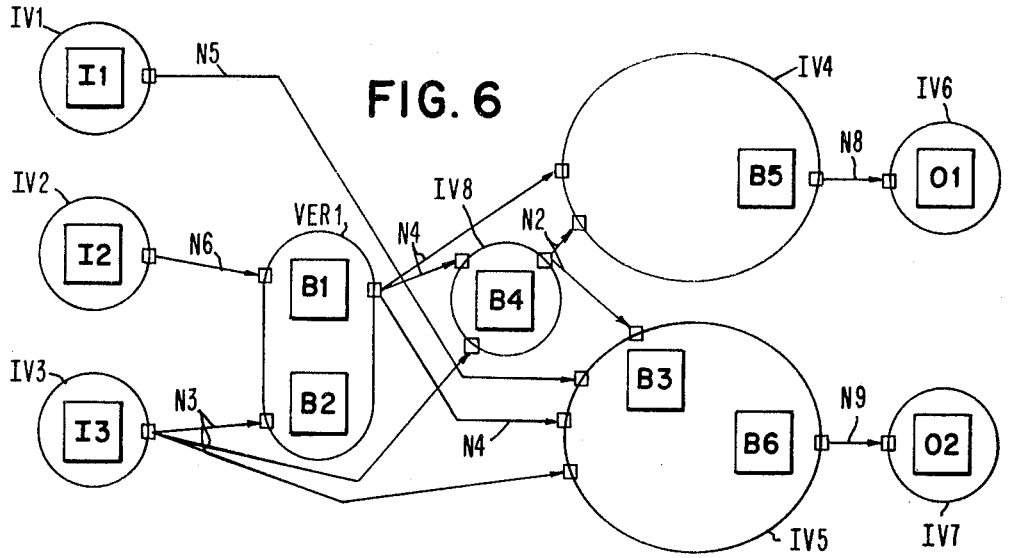
Figure 7:
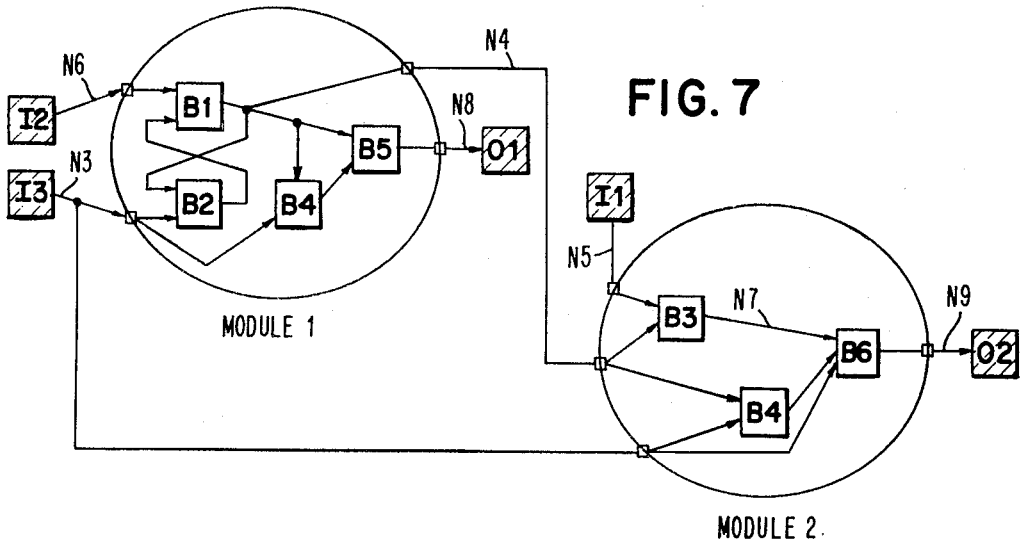

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED FEBRUARY 3, 1976

943 O.G. 74

T943,001

DYNAMIC REDUNDANCY METHOD FOR AN AUTOMATED LOGIC MAPPING SYSTEM

Angelo Mennone, Croton-on-Hudson, N.Y., assignor to International Business Machines Corporation, Armonk, N.Y.

Filed June 13, 1974, Ser. No. 479,074
**Int. Cl. G06f *15/56***
U.S. Cl. 444—1
8 Sheets Drawings. 36 Pages of Specification

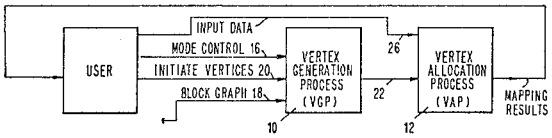

An automated circuit design system and process are provided including a technique for introducing redundancy of circuit element groups during the allocation of the circuit element groups to modules. The redundancy technique, which is embodied as a computer algorithm, functions when the allocation of redoundable element such as a circuit element group is made to a container module such as a circuit chip, during a discrete step allocation procedure which is designed to produce a mapping of a set of connected circuit elements. A minimum condition for obtaining a successful mapping is that each element can be allocated to at least one module. The operation of the process is made redundant to reduce the number of elements by one, namely the allocated element. The consequence of the operation is that the connected elements said to be fed by the redundant element (referred to as sink elements) are each combined by union with the redundant element. Other concomitant results of the operation are that the connections previously required between the redundant element and its sink elements will not be needed should any of the sink elements be allocated to different modules, and each sink element has acquired the attributes of the redundant element.

VERTEX GENERATION PROCESS (VGP)

VERTEX ALLOCATION PROCESS (VAP)

| | AREA | PINS |
|---|---|---|
| MODULE 1 | 2 | 1 |
| MODULE 2 | 4 | 4 |

FIG. 8

| | VER1 | IV5 |
|---|---|---|
| MODULE 1 | 1 | 2 |
| MODULE 2 | 3 | 4 |

PINS Pij

FIG. 9

| | VER1 | IV5 |
|---|---|---|
| MODULE 1 | 2 | 2 |
| MODULE 2 | 2 | 3 |

AREA Aij

FIG. 10

| | VER1 | IV5 |
|---|---|---|
| MODULE 1 | 132 | -K |
| MODULE 2 | 156 | 182 |

Fij

FIG. 11A

| VER 1 | IV5 |
|---|---|
| 132 | 144 |
| 156 | 182 |

Fij

FIG. 11B

| | VER1 | IV5 |
|---|---|---|
| R | $\frac{132}{156}$ | 0 |

FIG. 12A

| | VER 1 | IV5 |
|---|---|---|
| R | $\frac{132}{156} \approx .85$ | $\frac{144}{182} \approx .78$ |

FIG. 12B